(12) United States Patent
Lee

(10) Patent No.: US 7,083,893 B2
(45) Date of Patent: Aug. 1, 2006

(54) PHOTORESIST POLYMER AND PHOTORESIST COMPOSITION CONTAINING THE SAME

(75) Inventor: Geun Su Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/718,959

(22) Filed: Nov. 21, 2003

(65) Prior Publication Data

US 2004/0265735 A1    Dec. 30, 2004

(30) Foreign Application Priority Data

Jun. 27, 2003   (KR) .................. 10-2003-0042561

(51) Int. Cl.
G03C 1/73      (2006.01)
G03F 7/039     (2006.01)
G03F 7/20      (2006.01)
G03F 7/30      (2006.01)
G03F 7/38      (2006.01)
C08F 8/14      (2006.01)

(52) U.S. Cl. .................. 430/270.1; 430/325; 430/326; 430/905; 430/907; 430/914; 430/921; 430/919; 430/920; 430/925; 430/311; 430/319; 430/327; 430/328; 430/330; 430/331; 525/327.7; 526/281; 526/242; 526/271; 526/256; 526/268

(58) Field of Classification Search .............. 526/242; 430/270.1, 325, 326, 905, 907, 914, 921, 430/919, 920, 925, 311, 319, 327, 328, 330, 430/331

See application file for complete search history.

(56) References Cited

U.S. PATENT DOCUMENTS 6,455,226 B1 * 9/2002 Lee et al. ................ 430/270.1

2002/0172886 A1 * 11/2002 Momota et al. ............ 430/170
2003/0235785 A1 * 12/2003 Barclay et al. .......... 430/271.1

FOREIGN PATENT DOCUMENTS

EP    1164434 A2 * 12/2001

\* cited by examiner

*Primary Examiner*—Sin Lee
(74) *Attorney, Agent, or Firm*—Marshall, Gerstein & Borun LLP

(57) ABSTRACT

Photoresist polymers and photoresist compositions are disclosed. A photoresist polymer represented by Formula 1 and a photoresist composition containing the same have excellent etching resistance, thermal resistance and adhesive property, and high affinity to an developing solution, thereby improving LER (line edge roughness).

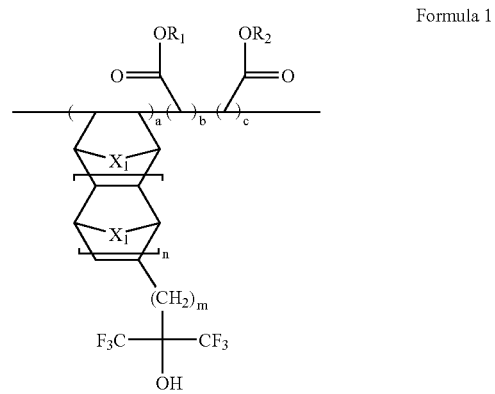

Formula 1 wherein $X_1$, $X_2$, $R_1$, $R_2$, m, n, a, b and c are as defined in the description.

19 Claims, 2 Drawing Sheets

PHOTORESIST POLYMER AND PHOTORESIST COMPOSITION CONTAINING THE SAME

BACKGROUND

1. Technical Field

Photoresist polymers and photoresist compositions containing the same are disclosed. More specifically, photoresist polymers and photoresist compositions containing the same are disclosed that may improve line edge roughness (hereinafter, referred to as 'LER') in a photoresist process using light sources of far ultraviolet regions of 190 nm and 157 nm.

2. Description of the Related Art

In order to be used for ArF and VUV (vacuum ultraviolet) resists, photoresist polymers and photoresist compositions are required to have low light absorbance at wavelengths of 193 nm and 157 nm, excellent etching resistance and adhesive property on the substrate, and to be developed with TMAH solution of 2.38 wt % and 2.6 wt %.

Recently, much research has been conducted on resins having a high transparency at 248 nm and 193 nm wavelengths and dry etching resistance similar to novolac resin.

Since the thickness of resist materials becomes thinner as circuits of semiconductor devices become more microscopic, improvement of LER of patterns has been promptly required.

The LER occurs more frequently in ArF resist patterns than in conventional KrF or i-line resist patterns. The conventional KrF or i-line resist materials include acidic alcohol groups while most ArF resist materials do not include acidic alcohol group. As a result, since the ArF resist materials have low affinity to basic developing solutions, the LER occurs more frequently in the ArF resist materials.

This phenomenon occurs more severely when patterns are formed using chemically amplified photoresist. The LER degrades stability and yield of semiconductor devices for performing a subsequent process.

SUMMARY OF THE DISCLOSURE

Photoresist polymers and photoresist compositions containing the same that have high affinity to developing solutions are disclosed.

A method for forming photoresist patterns using the disclosed compositions is disclosed.

DETAILED DESCRIPTION OF THE PRESENTLY PREFERRED EMBODIMENTS

Figure 1:
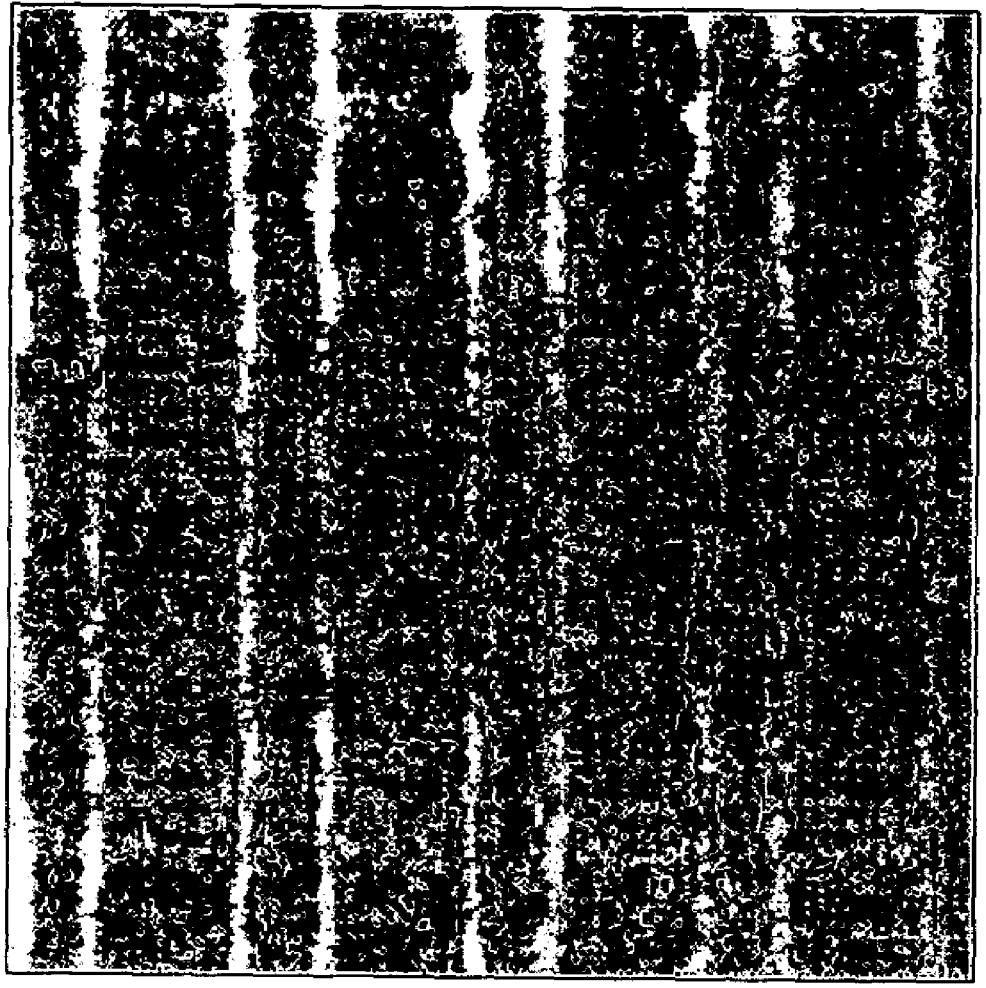
FIG. 1 is a photograph showing a L/S pattern obtained from Example 3.
Figure 2:
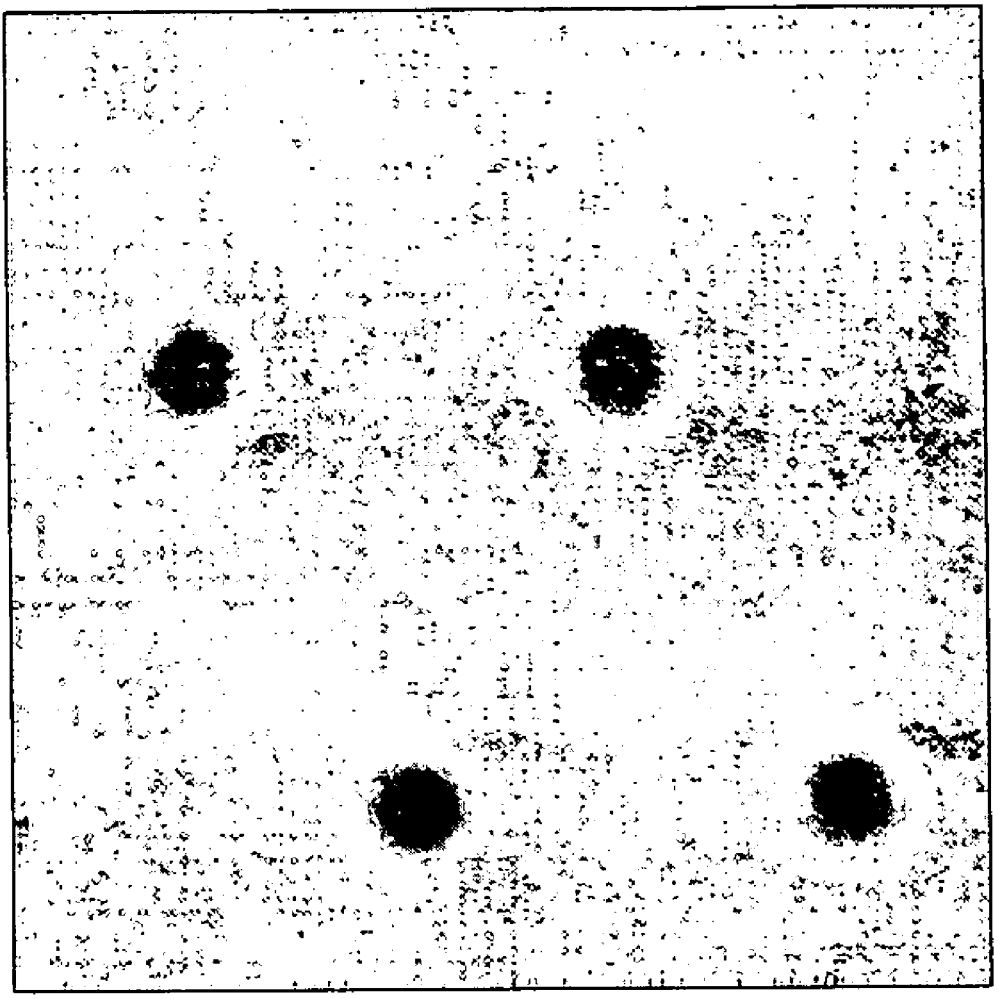
FIG. 2 is a photograph showing a contact hole pattern obtained from Example 4.

Photoresist polymers including acidic alcohol groups and photoresist compositions containing the same are disclosed.

A photoresist polymer comprises repeating unit represented by Formula 1:

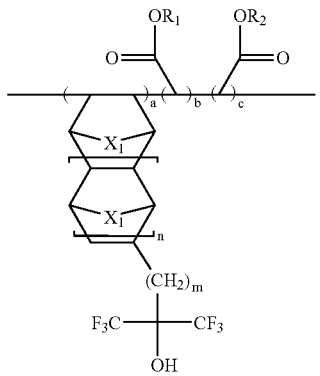

Formula 1 wherein, $X_1$ and $X_2$ individually are selected from the group consisting of $CH_2$, $CH_2CH_2$, O and S;

$R_1$ is selected from the group consisting of acid labile protecting group, $C_1$–$C_{20}$ alkyl and $C_1$–$C_{20}$ cycloalkyl;

$R_2$ is selected from the group consisting of H, $C_1$–$C_{20}$ alkyl, $C_5$–$C_{10}$ cycloalkyl, $C_5$–$C_{10}$ cycloalkyl including an ether group, and $C_5$–$C_{10}$ cycloalkyl including an ester group;

m is an integer ranging from 0 to 2, n is 0 or 1;

the relative ratio of a:b:c is in the range of 50 mol %: 20~50 mol %: 0~30 mol %.

The disclosed polymers including acidic alcohol groups have high affinity to basic developing solutions. In addition, since the disclosed polymers include fluorine atoms, absorbance of conventional hybrid-type photoresist may be improved.

The acid labile protecting group which may be left by acid determines solution to an alkaline developing solution of PR materials. That is, the acid labile protecting group prevents the compound from dissolving in the alkaline developing solution. If the acid labile protecting group is left by acid generated by exposure to light, the PR materials may be dissolved in the developing solution. Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methyl ethyl, 1-ethoxypropyl, 1-ethoxy-1-methyl ethyl, 1-methoxyethyl, 1-ethoxyethyl, t-butoxyethyl, 1-isobutoxyethyl and 2-acetylment-1-yl.

Preferable example of the repeating unit represented by Formula 1 is selected from the group consisting of the following Formulas 2 or 3;

Formula 2

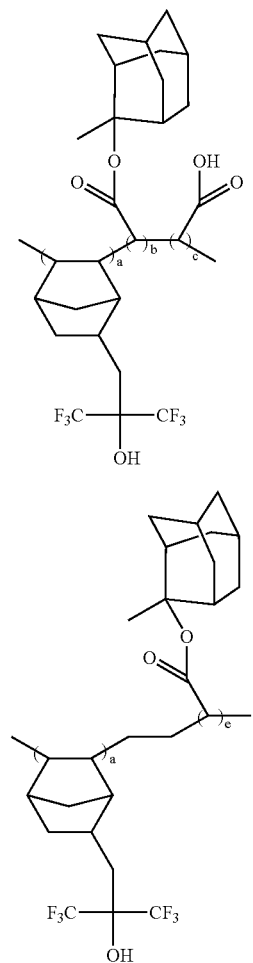

Formula 3

-continued

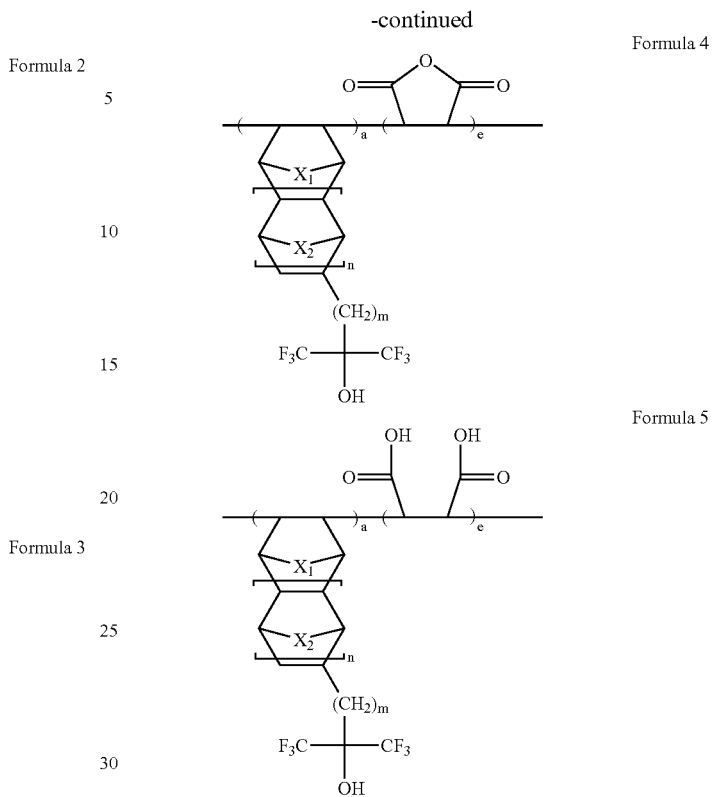

wherein, $X_1$ and $X_2$ individually are selected from the group consisting of CH2, CH2CH2, O and S;

m is an integer ranging from 0 to 2, n is 0 or 1; and the relative ratio of a:e is 50 mol %:50 mol %.

The polymerization reaction which is radical polymerization is performed as types of bulk polymerization or solution polymerization. As disclosed in WO 96/37526 (Nov. 28, 1996), the polymerization may be performed using metal catalyst.

Preferably, the polymerization of the step (a) is performed using single or mixture solution selected from the group consisting of cyclohexanone, cyclopentanone, tetrahydrofuran, dimethyl-formamide, dimethylsulfoxide, dioxane, methylethylketone, benzene, toluene and xylene.

Additionally, the polymer initiator of the step (a) is preferably selected from the group consisting of benzoyl peroxide, 2,2'-azobisisobutyronitrile (AIBN), acetyl-perfoxide, laurylperoxide, t-butylperacetate, t-butylhydroperoxide and di-t-butylperoxide.

The polymer obtained from the step (a) is preferably crystallized and purified using single or mixture solution selected from the group consisting of dimethylether, petroleum ether, methanol, ethanol, lower alcohol including isopropanol, and water.

The step (c) is a reaction for partially protecting the carboxyl group of Formula 5 by reacting the compound of Formula 5 with the compound having the protecting group. The compound having the protecting group is preferably selected from the group consisting of C1–C20 alkyl, C5–C10 cycloalkyl and C5–C10 cycloalkyl including an ether group or ester group in cyclic ring.

wherein, the relative ratio of a:b:c is in the range of 50 mol %: 20~50 mol %: 0~30 mol %; and the relative ratio of a:e is 50 mol %:50 mol %.

A method for forming a photoresist polymer comprises:

(a) polymerizing a compound of Formula 7 and maleic-anhydride under the presence of polymer initiators to obtain a polymer of Formula 4;

(b) reacting a polymer of Formula 4 with alcohol or an alkoixde compound and ring-opening maleic anhydride in the polymer to obtain a polymer of Formula 5; and (c) esterifying or acetylating a partial or whole carboxyl group of a polymer of Formula 5 to obtain the repeating unit of Formula 1:

Formula 7

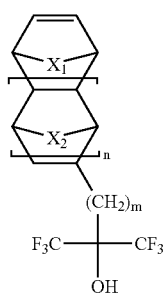

In addition, a photoresist composition is disclosed that comprises the photoresist polymer described above, a photoacid generator and an organic solvent.

Any of conventional photoacid generators, which are able to generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Sulfide type or onium type compounds are primarily used for the photoacid generator. More preferably, the photoacid generator is selected from the group consisting of phthalimidotrifluoromethane sulfonate, dinitrobenzyl-tosylate, n-decyl disulfone and naphthylimido trifluoro-methane sulfonate having low absorbance at 157 nm and 193 nm. Also, the photoacid generator may be further selected from the group consisting of diphenyl iodide hexafluorophosphate, diphenyl iodide hexafluroro-arsenate, diphenyl iodide hexafluoroantimonate, diphenyl p-methoxyphenylsulfonium triflate, diphenyl p-toluenyl-sulfonium triflate, diphenyl p-isobutylphenyl-sulfonium triflate, triphenylsulfonium hexafluororarsenate, triphenylsulfonium hexafluoro-antimonate, triphenyl-sulfonium triflate, and dibutyl-naphthyl-sulfonium triflate.

The photoacid generator is preferably present in an amount ranging from 0.05 to 10 wt % based on the amount of photoresist polymer present. If the photoresist generator is present in the amount of less than 0.05 wt %, it lowers photosensitivity of the photoresist composition to light. If the photoacid generator is present in the amount of more than 10 wt %, it results in a poor pattern formation due to its high absorption of far ultraviolet rays.

Any of the organic solvents can be used. Some of conventional organic solvents are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the organic solvent is selected from the group consisting of diethylene glycol diethyl ether, methyl 3-methoxypropionate, ethyl 3-ethoxypropionate, propylene glycol methyl ether acetate, cyclohexanone, 2-heptanone, and ethyl lactate. The organic solvent is present in an amount ranging from 500 to 2000 wt % based on the amount of photoresist polymer present in order to obtain a desired thickness of the photoresist film. For example, the thickness of the photoresist film is about 0.25 μm when the organic solvent is present in the amount of 1000 wt % based on the amount of photoresist polymer present.

A method for forming a photoresist pattern comprises:

(a) coating the photoresist composition described above on a wafer to form a photoresist film;

(b) exposing the photoresist film to light;

(c) baking the exposed photoresist film; and (d) developing the resulting structure to obtain a photoresist pattern.

The above method may further comprise performing a bake process before exposure of the step (b). Here, the bake process is performed at a temperature ranging from 70 to 200° C.

The exposure process is performed using the light selected from the group consisting of ArF, KrF, EUV (Extreme Ultra Violet), VUV (Vacuum Ultra Violet), E-beam, X-ray and ion beam with exposure energy ranging from 0.1 to 100 mJ/cm$^2$.

The development of the step (d) is preferably performed using an alkali developing solution such as TMAH aqueous solution in an amount ranging from 0.01 to 5 wt %.

A semiconductor device manufactured according to the method described above is also disclosed.

The disclosed photoresist polymers and photoresist compositions containing the same will be described in more details by referring to examples below, which are not intended to be limiting.

I. Preparation of Photoresist Polymers

EXAMPLE 1

Synthesis of Compound of Formula 2

Step 1

To 60 mL of tetrahydrofuran were added norbornen hexafluoro isopropylalcohol (0.1 M), maleicanhydride (0.1 M) and AIBN (0.2 g). The resulting mixture was reacted at 65° C. for 24 hours, and then distilled under reduced pressure. Polymers were precipitated in diethylether, and filtered, thereby obtaining the polymer of Formula 4a (yield 75%, Mw=6530).

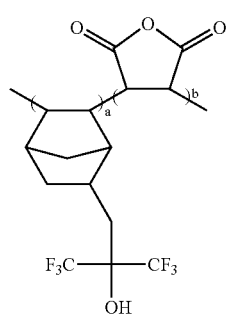

Formula 4a

Step 2

To 100 mL of distilled water were added the polymer (20 g) of the above step 1 and sulfuric acid (0.01 g). The resulting mixture was reacted at 100° C. for 4 hours. After the reaction, the resulting mixture was cooled to 5° C. to precipitate polymers. Then, the polymers were filtered with a cool water of 500 mL to remove acids, and dehydrated, thereby obtaining the polymer of Formula 5a.

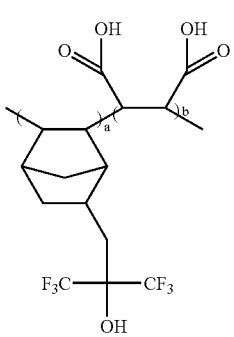

Formula 5a

Step 3

The polymer (0.1 M) of the above step 2 was mixed with thionylchloride (SOCl2) (50 mL). The resulting mixture was refluxed for 5 hours. Then, the thionylchloride was removed with vacuum distillation, thereby obtaining the polymer of Formula 6 (yield: 100%).

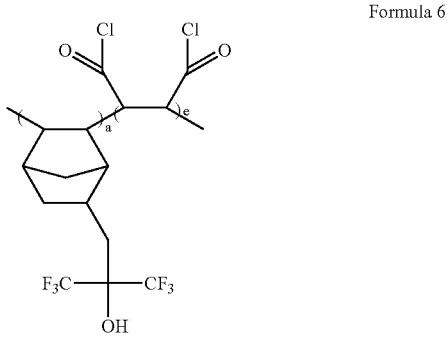

Formula 6

Step 4

To dried methylenechloride (CH$_2$C$_{12}$) (100 mL) using magnesium sulfate (MgSO4) were added the polymer (0.1 M) of the above step 3 and 2-methyl-2-adamantanol (0.19 M). The resulting mixture was slowly added to triethylamine (N(C$_2$H$_5$)$_3$) (0.11 M), and then reacted at 25° C. for 4 hours. After the reaction, the resulting mixture was filtered and distilled to remove the solvent. The obtained product was washed with water/ethanol (1:1) and dehydrated, thereby obtaining the polymer of Formula 2 (yield: 95%).

EXAMPLE 2

Synthesis of Polymer of Formula 3

To dried methylenechloride (CH$_2$C$_{12}$) (100 mL) using magnesium sulfate (MgSO$_4$) were added the polymer (0.1 M) obtained from the above step 3 of Example 1 and 2-methyl-2-adamantanol (0.21 M). The resulting mixture was slowly added to triethylamine (N(C$_2$H$_5$)$_3$) (0.11 M), and then reacted at 25° C. for 6 hours. After the reaction, the resulting mixture was filtered and distilled to remove the solvent. The obtained product was washed with water/ethanol (1:1) and dehydrated, thereby obtaining the polymer of Formula 3 (yield: 91%).

II. Preparation of Photoresist Compositions and Formation of Patterns

EXAMPLE 3

To propylene glycol methyl ether acetate (PGMEA) (20 g) were added the polymer (2 g) obtained from the step 4 of Example 1, phthalimidotrifluoromethane sulfonate (0.024 g) and triphenylsulfonium triflate (0.06 g) which are photoacid generators. The resulting mixture was filtered with a 0.20 μm filter, thereby obtaining a photoresist composition.

The photoresist composition was spin-coated on a silicon wafer to form a photoresist film, and soft-baked at 130° C. for 90 seconds. After baking, the photoresist was exposed to light using an ArF laser exposer, and then post-baked at 130° C. for 90 seconds. The baked wafer was developed in 2.38 wt % TMAH aqueous solution for 40 seconds to obtain 0.08 μm of L/S pattern (see FIG. 1).

EXAMPLE 4

The procedure of Example 3 was repeated using the polymer (2 g) of Example 2 instead of the polymer of Example 1 to obtain the pattern of 0.08 μm of L/S pattern.

As discussed earlier, patterns having the improved LER can be obtained because the disclosed photoresist compositions including acidic alcohol groups have high affinity to basic developing solutions. Additionally, ultra microscopic patterns of 4G, 16G DRAMs as well as of less than 1 G DRAM can be obtained because the disclosed photoresist compositions containing polymers including fluorine have low absorbance at 193 nm and 157 nm.

What is claimed is:

1. A photoresist polymer consisting of a repeating unit represented by Formula 1:

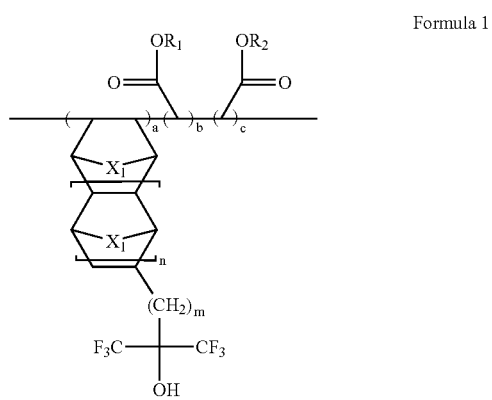

Formula 1 wherein
X$_1$ and X$_2$ individually are selected from the group consisting of CH$_2$, CH$_2$CH$_2$, O and S;
R$_1$ is selected from the group consisting of acid labile protecting group, C$_1$–C$_{20}$ alkyl and C$_1$–C$_{20}$ cycloalkyl;
R$_2$ is H, C$_1$–C$_{20}$ alkyl, C$_5$–C$_{10}$ cycloalkyl, or C$_5$–C$_{10}$ cycloalkyl including an ether group, and C$_5$–C$_{10}$ cycloalkyl including an ester group;
m is an integer ranging from 0 to 2,
n is an integer of 0 or 1; and
the relative ratio of a:b:c is in the range of 50 mol %:20~50 mol %:0~30 mol %.

2. The photoresist polymer according to claim 1, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methyl ethyl, 1-ethoxypropyl, 1-ethoxy-1-methyl ethyl, 1-methoxyethyl, 1-ethoxyethyl, t-butoxyethyl, 1-isobutoxyethyl and 2-acetylment-1-yl.

3. The photoresist polymer according to claim 1, wherein the repeating unit of Formula 1 is further characterized by a repeating unit of Formula 2 or 3:

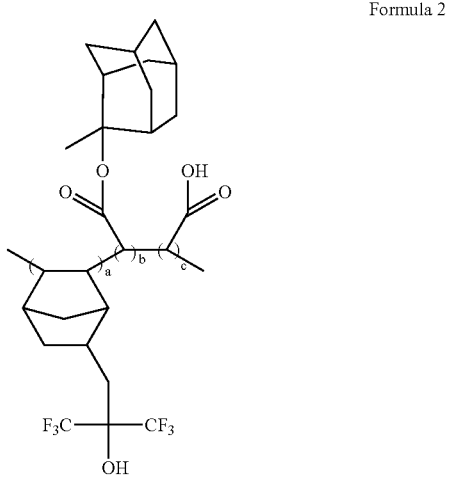

Formula 2

-continued

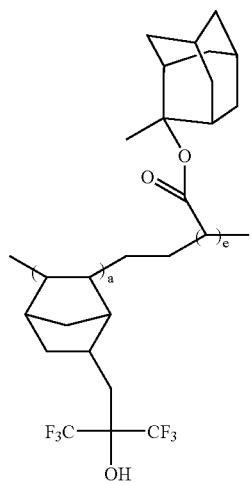

Formula 3 wherein
the relative ratio of a:b:c is in the range of 50 mol %:20~50 mol %:0~30 mol %; and
the relative ratio of a:e is 50 mol %:50 mol %.

4. A photoresist composition comprising a photoresist polymer of claim 1, a photoacid generator and an organic solvent.

5. The photoresist composition according to claim 4, wherein the photoacid generator is selected from the group consisting of phthalimidotrifluoromethane sulfonate, dinitrobenzyltosylate, n-decyl disulfone and naphthylimido trifluoromethane sulfonate.

6. The photoresist composition according to claim 5, wherein the photoacid generator comprises
   (i) a first photoacid generator selected from the group consisting of phthalimidotrifluoromethane sulfonate, dinitrobenzyltosylate, n-decyl disulfone and naphthylimido trifluoromethane sulfonate; and
   (ii) a second photoacid generator selected from the group consisting of diphenyl iodide hexafluorophosphate, diphenyl iodide hexafluroroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluororarsenate, triphenylsulfonium hexafluoro-antimonate, triphenylsulfonium triflate, and dibutyl-naphthylsulfonium triflate.

7. The photoresist composition according to claim 4, wherein the photoacid generator is present in an amount ranging from 0.05 to 10 wt % based on the amount of photoresist polymer.

8. The photoresist composition according to claim 4, wherein the organic solvent is selected from the group consisting of diethylene glycol diethyl ether, methyl 3-methoxypropionate, ethyl 3-ethoxypropionate, propylene glycol methyl ether acetate, cyclohexanone, 2-heptanone, and ethyl lactate.

9. The photoresist composition according to claim 4, wherein the organic solvent is present in an amount ranging from 500 to 2000 wt % based on the amount of photoresist polymer.

10. A method for forming a photoresist pattern, comprising the steps of:
(a) coating the photoresist composition of claim 8 on a wafer to form a photoresist film;
(b) exposing the photoresist film to light;
(c) baking the exposed photoresist film; and
(d) developing the resulting structure to obtain a photoresist pattern.

11. The method according to claim 10, further comprising performing a bake process before exposure of step (b).

12. The method according to claim 10, wherein the bake process is performed at a temperature ranging from 70 to 200° C.

13. The method according to claim 10, wherein the light is selected from the group consisting of ArF, KrF, EUV (Extreme Ultra Violet), VUV (Vacuum Ultra Violet), E-beam, X-ray and ion beam.

14. The method according to claim 10, wherein the exposure process is performed with exposure energy ranging from 0.1 to 100 mJ/cm$^2$.

15. The method according to claim 10, wherein the development of step (d) is performed using an alkali developing solution.

16. A method for forming a photoresist polymer, comprising the steps of:
(a) polymerizing a compound of Formula 7 and maleicanhydride under the presence of polymer initiators to obtain a polymer of Formula 4;
(b) reacting a polymer of Formula 4 with alcohol or an alkoixde compound and ring-opening maleic anhydride in the polymer to obtain a polymer of Formula 5; and
(c) esterifying or acetylating a partial or whole carboxyl group of a polymer of Formula 5 to obtain the repeating unit of following Formula 1:

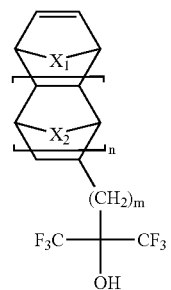

Formula 7

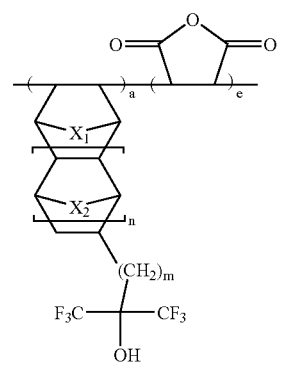

Formula 4

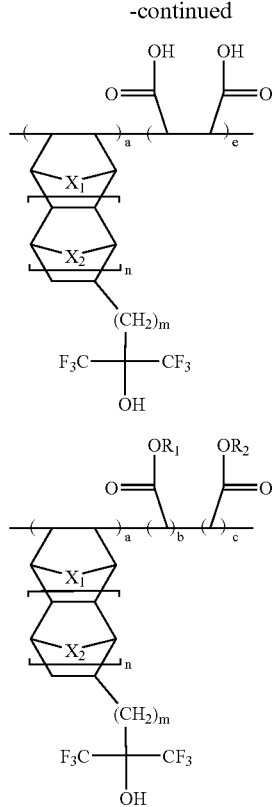

Formula 5

Formula 1 wherein
$X_1$ and $X_2$ individually are selected from the group consisting of $CH_2$, $CH_2CH_2$, O and S;

$R_1$ is selected from the group consisting of acid labile protecting group, $C_1$–$C_{20}$ alkyl and $C_1$–$C_{20}$ cycloalkyl;

$R_2$ is selected from the group consisting of H, $C_1$–$C_{20}$ alkyl, $C_5$–$C_{10}$ cycloalkyl, $C_5$–$C_{10}$ cycloalkyl including an ether group, and $C_5$–$C_{10}$ cycloalkyl including an ester group;

m is an integer ranging from 0 to 2, n is 0 or 1;

the relative ratio of a:b:c is in the range of 50 mol %:20~50 mol %:0~30 mol %; and the relative ratio of a:e is 50 mol %:50 mol %.

17. The method according to claim 16, wherein the polymerization of step (a) is performed using single or mixture solution selected from the group consisting of cyclohexanone, cyclopentanone, tetrahydrofuran, dimethylformamide, dimethylsulfoxide, dioxane, methylethylketone, benzene, toluene and xylene.

18. The method according to claim 16, wherein the polymer initiator of step (a) is selected from the group consisting of benzoyl peroxide, 2,2'-azobisisobutyronitrile (AIBN), acetylperfoxide, laurylperoxide, t-butylperacetate, t-butylhydroperoxide and di-t-butylperoxide.

19. The method according to claim 16, wherein the polymer obtained from step (a) is crystallized and purified using single or mixture solution selected from the group consisting of dimethylether, petroleum ether, methanol, ethanol, lower alcohol including iso-propanol, and water.

* * * * *